(12) United States Patent
Yang et al.

(10) Patent No.: US 7,310,224 B2
(45) Date of Patent: Dec. 18, 2007

(54) ELECTRONIC APPARATUS WITH THERMAL MODULE

(75) Inventors: Chih-An Yang, Shindian (TW);
Chung-An Lin, Shindian (TW)

(73) Assignee: VIA Technologies, Inc., Taipei (TW)

( * ) Notice: Subject to any disclaimer, the term of this patent is extended or adjusted under 35 U.S.C. 154(b) by 57 days.

(21) Appl. No.: 11/237,678

(22) Filed: Sep. 29, 2005

(65) Prior Publication Data
US 2006/0274497 A1 Dec. 7, 2006

(30) Foreign Application Priority Data
Jun. 3, 2005 (TW) .............................. 94118436 A

(51) Int. Cl.
*G06F 1/20* (2006.01)
(52) U.S. Cl. ..................... 361/687; 257/737; 438/614
(58) Field of Classification Search ................ 257/737, 257/738; 438/613, 614; 34/78; 361/679–687, 361/724–727
See application file for complete search history.

(56) References Cited

U.S. PATENT DOCUMENTS 5,535,526 A * 7/1996 White .......................... 34/78
6,165,885 A * 12/2000 Gaynes et al. .............. 438/612

\* cited by examiner

*Primary Examiner*—Hung Van Duong
(74) *Attorney, Agent, or Firm*—Birch, Stewart, Kolasch & Birch, LLP

(57) ABSTRACT

An electronic apparatus includes a package, a circuit board, a thermal dissipating module and a thermal transmitting module. The package includes a substrate, a heat source and a plurality of electric terminals electrically connected to the circuit board. The heat source and the electric terminals are disposed on a surface of the substrate facing to the circuit board. The heat source is located between the substrate and the circuit board. The thermal transmitting module passes through the electric connection structures between the package and the circuit board and connects the heat source of the package with the thermal dissipating module. Thus, the thermal transmitting module enhances the thermal dissipating efficiency for the heat source of the package and improves the reliability of the electronic apparatus.

19 Claims, 4 Drawing Sheets

ELECTRONIC APPARATUS WITH THERMAL MODULE

BACKGROUND OF THE INVENTION

1. Field of Invention

The present invention relates to an electronic apparatus, and more particularly, to an electronic apparatus with a thermal transmitting module.

2. Related Art

Accompanying to the development of semiconductor device and process, more and more functionalities are integrated within the same scale size. That is, more heats are dissipated from the same area. The heat dissipation has become an essential issue in order to maintain a normal operation. In addition, multiple chips trend to be packaged as a multiple packaging module (MPM), and much more heats are dissipated from the package within the same area. An excellent packaging structure for the electronic apparatus is thus important to provide an effective thermal dissipating efficiency.

FIG. 1 shows a cross-sectional view of a conventional electronic apparatus. An electronic apparatus 100 includes a package 110 of stacked MPM electrically connected to a circuit board 130. The electronic apparatus 100 will dissipate heats during operations. The package 110 is thermal dissipated by a thermal dissipating module 120 consisted of for example a heatsink and a fan. The package 110 includes a substrate 111, a first chip 112, a second chip 113 and a plurality of electric terminals 114. The first chip 112 and the electric terminals 114 are located on a surface 115 of the substrate 111 and the second chip 113 is located on the other surface of the substrate 111. That is, the package 110 includes two chips 112, 113 respectively located on different surfaces of the package 110. The first chip 112 and the second chip 113 are respectively electrically and physically connected to the substrate 111. The chips 112, 113 and the electrical connecting structures are protected by packaging processes to form the package 110. The electric terminals 114 are exposed to a surface of the package 110 facing to the circuit board 130 and are electrically connected to the circuit board 130.

The first chip 112 and the second chip 113 are respectively seen as a first heat source and a second heat source to the electronic apparatus 100 because of thermal dissipated from the electronic apparatus 100 during operations. The thermal dissipating module 120 is in contact with the second chip 113 to dissipate heats from the second chip 113. The first chip 112 is thermal dissipated through the substrate 111 and the second chip 113 to the thermal dissipating module 120. The package 110 is thus not performed an effective thermal dissipation and which leads to the raise of the operation temperature and the degradation of the efficiency and reliability of the electronic apparatus 100.

Because the heat sources of the package of MPM between the package and the circuit board has no effective thermal transmitting path, which leads to the operation temperature of the electronic apparatus is too high to be normally operated.

It is therefore an important subject of the present invention to provide an electronic apparatus with a thermal transmitting module to perform an effective thermal dissipation.

SUMMARY OF THE INVENTION

In view of the foregoing, the present invention is to provide an electronic apparatus with a thermal transmitting module applied to a package for thermal dissipation. The package is disposed on a circuit board and includes a surface facing to the circuit board. At least one heat source and a plurality of electric terminals are disposed on the surface to electrically connect with the circuit board. The present invention provides an effective thermal transmitting path, which enhancing the thermal dissipating efficiency and improving the reliability of the electronic apparatus.

To achieve the aspects, an electronic apparatus with a thermal transmitting module according to the present invention is applied to a package of MPM for thermal dissipation. The package is disposed over a circuit board and includes a substrate, a first chip, a second chip and a plurality of electric terminals. The first chip, the second chip and the electric terminals are disposed on the substrate. The electric terminals are exposed to a surface of the package facing to the circuit board and are electrically connected to the circuit board.

To achieve the aspects, an electronic apparatus according to the present invention includes a circuit board, the package described herein above, a thermal transmitting module and a thermal dissipating module. The thermal dissipating module and the package are located at the same side of the circuit board. The thermal transmitting module provides a thermal transmitting path from a heat source to the thermal dissipating module. The thermal transmitting path is located between the package and the circuit board and passes through the package or the electrical connecting structures between the package and the circuit board.

The electronic apparatus may further include an intermediate body as the electrical connection between the package and the circuit board to facilitate the thermal transmitting module passing through the electrical connecting structures between the package and the circuit board.

The thermal transmitting module includes a body and at least one connecting part. The body is connected to a surface of the heat source and passes through the electrical connecting structures between the package and the circuit board. The connecting part is extended outward from the body to connect with the thermal dissipating module.

The electronic apparatus may further include at least one bridge unit. The thermal transmitting module is connected to the thermal dissipating module through the bridge unit.

As mentioned above, by disposing a thermal transmitting module with an electronic apparatus according to the present invention may provide an effective thermal transmitting path, which enhancing the thermal dissipating efficiency and improving the reliability of the electronic apparatus.

BRIEF DESCRIPTION OF THE DRAWINGS

The present invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

The present invention provides a thermal transmitting path to an electronic apparatus. The electronic apparatus includes a package disposed over a circuit board. The first package has a surface facing to the circuit board and the surface has at least one heat source.

Figure 1:
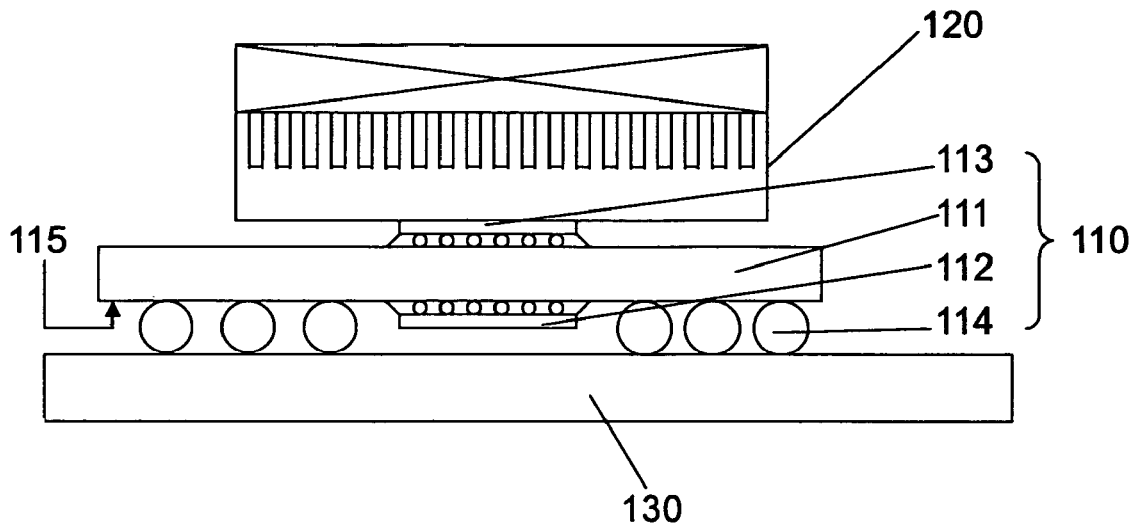
FIG. 1 is a cross-sectional view showing a conventional electronic apparatus.
Figure 2:
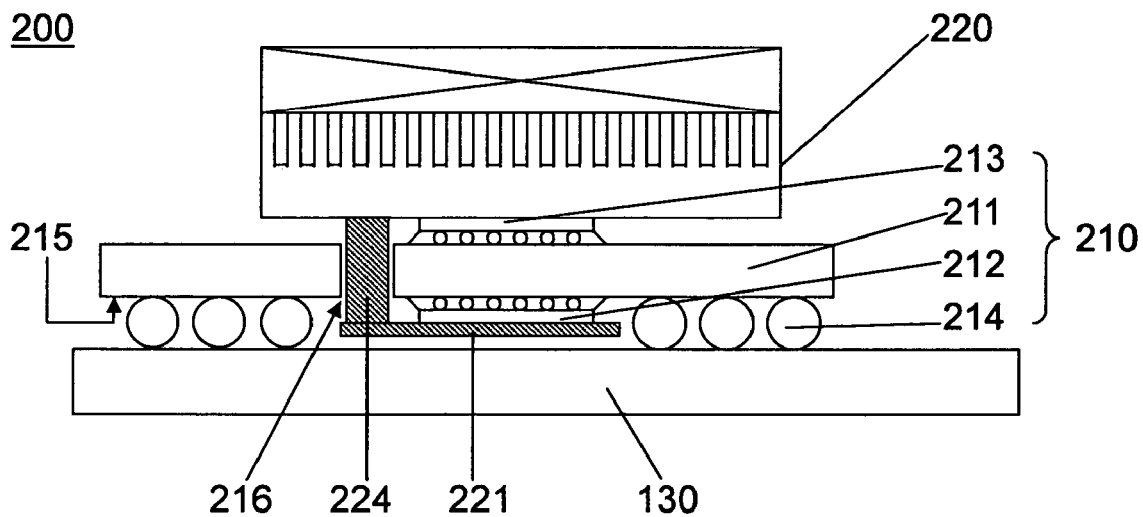
FIG. 2 is a cross-sectional view showing a first preferred embodiment of an electronic apparatus according to the present invention.

FIG. 2 shows a cross-sectional view of a first preferred embodiment of an electronic apparatus 200 according to the present invention. A package 210 of stacked MPM includes a substrate 211, a first chip 212, a second chip 213 and a plurality of electric terminals 214. The first chip 212 and the second chip 213 are respectively electrically connected to the corresponding surfaces of the substrate 211 by a flip-chip packaging technology.

The package 210 is electrically connected with the circuit board 130 through the electric terminals 214 to form an electronic apparatus 200. The electric terminal 214 may be a solder ball, a pin or a conductive block to be electrically and physically connected between the circuit board 130 and the package 210 by surface mounting technology (SMT) or anti-isotropic conductive film (ACF).

The first chip 212 and the electric terminals 214 are located on the surface 215 of the substrate 211 and the second chip 213 is located on the other surface of the substrate 211 apart from the circuit board 130. The first chip 212 and the second chip 213 are heat sources of the electronic apparatus 200. The first chip 212 and the second chip 213 are thermal dissipated during the operation of the electronic apparatus 200. A thermal dissipating module 220 is located over the surface of the package 210 apart from the circuit board 130 and is connected with the exposed portion of the second chip 213. The second chip 213 is thermal dissipated to the thermal dissipating module 220 through the interface between the second chip 213 and the thermal dissipating module 220. The electronic apparatus 200 further includes a thermal transmitting module 221 and at least one bridge unit 224. The thermal transmitting module 221 is located between the package 210 and the circuit board 130 and is connected to the exposed portion of the first chip 212. The bridge unit 224 passes through the substrate 211 and is connected between the thermal dissipating module 220 and the thermal transmitting module 221. The first chip 212 is thermal dissipated to the thermal dissipating module 220 through the thermal transmitting module 221 and the bridge unit 224. The thermal transmitting path may enhance the thermal dissipating efficiency to the package 210.

As shown in FIG. 2, the substrate 211 has at least one through hole 216 to be passed through by the bridge unit 224. In order to enhance the thermal dissipating efficiency, the thermal transmitting module 221 and the bridge unit 224 may be made by metal with high thermal conductivity, for example copper, aluminum or their alloy. The thermal transmitting module 221 and the bridge unit 224 may be formed individually or by one-piece molding, and then be fixed on the thermal dissipating module 220. The thermal transmitting module 221 may also be formed by a metal block connected with at least one heat pipe. The metal block is connected to the exposed portion of the first chip 212 and then connected to the bridge unit 224 through the heat pipe in order to enhance the thermal dissipating efficiency of the thermal transmitting module 221. Please note that the thermal transmitting module 221 cannot be in contact with the circuit board 130 or the electric terminals 214 of the package 210 because the thermal transmitting module 221 is made of conductive material. The thermal dissipating module 220 may be consisted of heatsink, fan or heat pipe.

Figure 3:
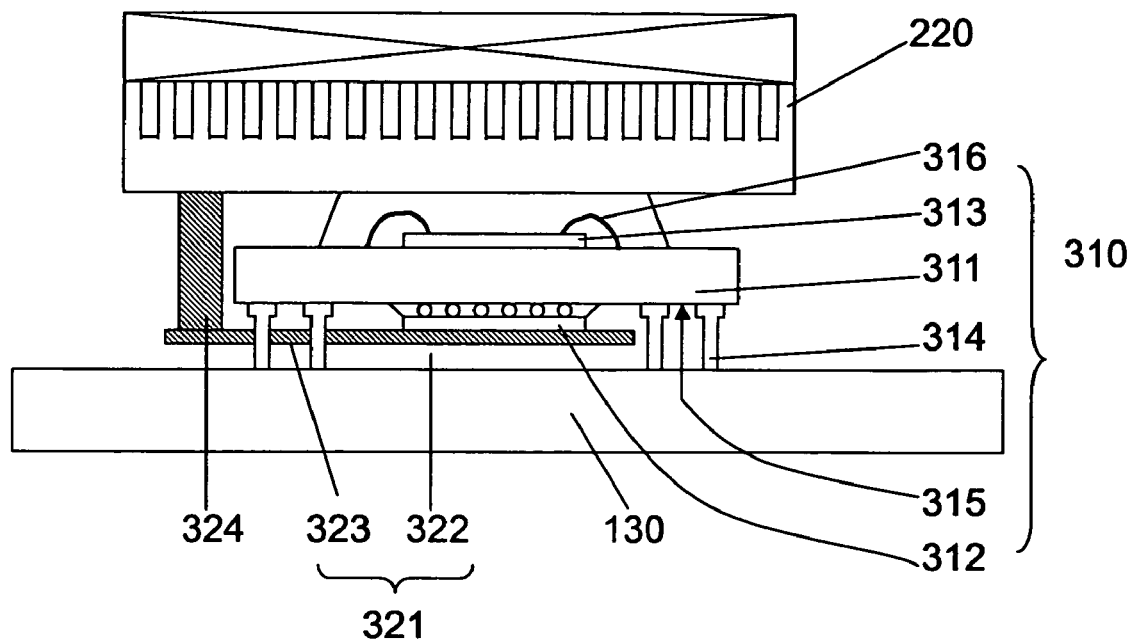
FIG. 3 is a cross-sectional view showing a second preferred embodiment of an electronic apparatus according to the present invention.

FIG. 3 shows a cross-sectional view of a second preferred embodiment of an electronic apparatus 300 according to the present invention. A package 310 of pin grid array (PGA) package includes a substrate 311, a first chip 312, a second chip 313 and a plurality of electric terminals 314. The first chip 312 and the electric terminals 314 are located at one side of the substrate 311, and the second chip 313 is located at the other side of the substrate 311. The first chip 312 is connected to a surface 315 of the package 310 facing to a circuit board 130 by a flip-chip packaging technology. The second chip 313 is electrically connected to the electric terminals 314 through a plurality of bonding wires 316 and the internal circuit of the substrate 311. The electric terminals 314 of the package 310 are exposed out of the surface 315 to electrically connect with the circuit board 130. A thermal dissipating module 220 is located over the other surface of the package 310 to be thermal dissipated from the second chip 313.

In order to thermal dissipate heats from the first chip 312 between the substrate 311 and the circuit board 130, a thermal transmitting module 321 may include a body 322 and at least one connecting part 323. The body 322 is connected to a surface of the first chip 312 and the connecting part 323 is extended outward from the body 322 to connect with at least one bridge unit 324. The bridge unit 324 is connected between the connecting part 323 and the thermal dissipating module 220. The first chip 312 is thermal dissipated sequentially through the body 322, the connecting part 323 and the bridge unit 324 to the thermal dissipating module 220. The thermal transmitting path may enhance the thermal dissipating efficiency to the electronic apparatus 300. In this embodiment, the substrate 311 needs no through hole and which ensures the mechanical strength of the substrate 311 and lifetime of the package 310. Please note that the connecting part 323 fixed on the surface 315 of the package 310 passes through the electric terminals 314 and cannot be in contact with the electric terminals 314 and the circuit board 130.

Figure 4A:
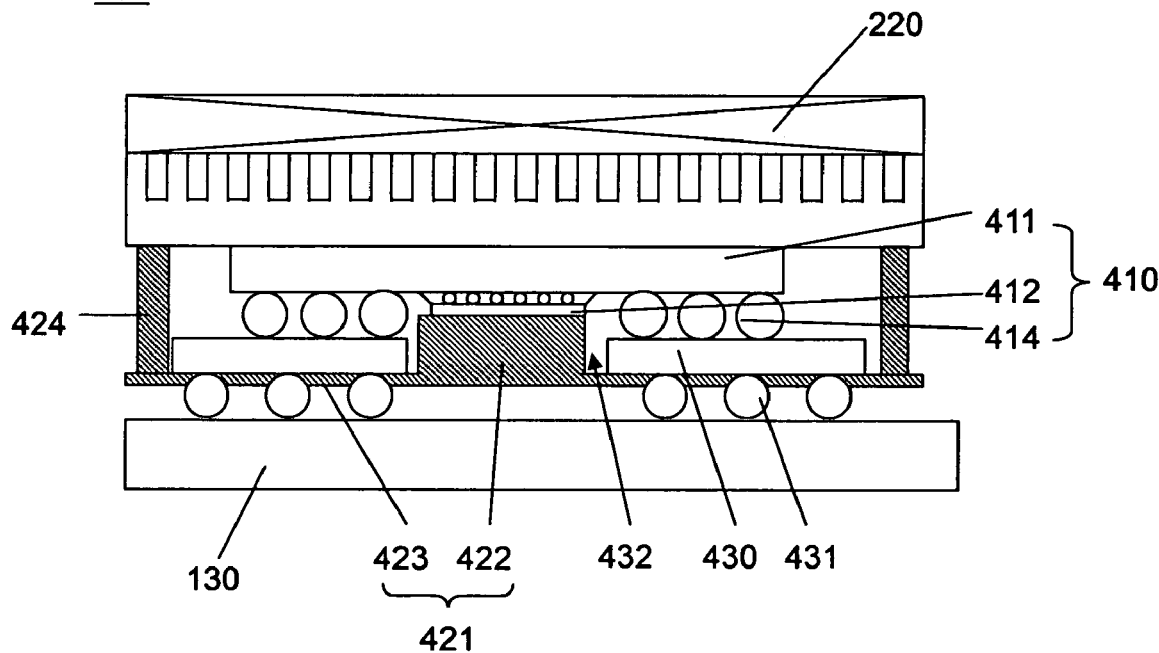
FIG. 4a is a cross-sectional view showing a third preferred embodiment of an electronic apparatus according to the present invention.

FIG. 4a shows a cross-sectional view of a third preferred embodiment of an electronic apparatus 400 according to the present invention. The electronic apparatus 400 includes a package 410 and a thermal dissipating module 220 sequentially disposed at the same side of a circuit board 130. The package 410 includes a substrate 411, a chip 412 and a plurality of electric terminals 414 electrically connected with the package 410 and the circuit board 130. The chip 412 and the electric terminals 414 are located at the same side of the substrate 411. In this embodiment, a thermal transmitting module 421, a plurality of bridge units 424 and an intermediate body 430 are applied to enhance the thermal dissipating efficiency of the chip 412. The intermediate body 430 is used for electrically connecting between the package 410 and the circuit board 130. The electric terminals 414 are connected to the circuit board 130 sequentially through one side of the intermediate body 430, the internal circuit of the intermediate body 430 and a plurality of conductors 431 on the other side of the intermediate body 430. The conductors 431 are one-to-one corresponding to the electric terminals 414. The re-distributed pitch between the conductors 431 may be enlarged by the intermediate body 430 to facilitate the thermal transmitting module 421 being passed between the electric terminals 414. The intermediate body 430 may further have a through hole 432 to expose a portion of the chip 412.

The thermal transmitting module 421 includes a body 422 and at least one connecting part 423. The body 422 is made of metal of high thermal conductivity and passes through the through hole 432 of the intermediate body 430 to connect with the exposed portion of the chip 412. The body 422 may directly connect with the chip 412 or connect with the chip 412 through a thermal interface material (TIM). The connecting part 423 located between the circuit board 130 and the intermediate body 430 is fixed on a surface of the intermediate body 430, which is extended outward from the body 422 and passing through but not electrically connecting with the conductors 431. The connecting part 423 is connected to the bridge units 424 and then connected to the thermal dissipating module 220. The chip 412 is thermal dissipated sequentially through the body 422, the connecting part 423 and the bridge unit 424 to the thermal dissipating module 220.

Figure 4B:
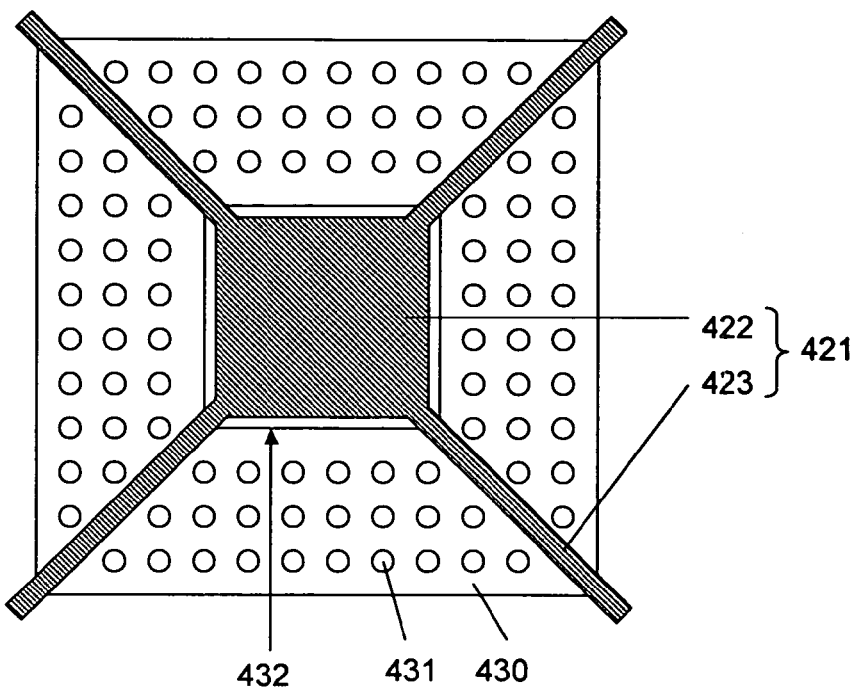
FIG. 4b is a bottom view showing an intermediate body and a thermal transmitting module of the third preferred embodiment of an electronic apparatus according to the present invention.

FIG. 4b shows a bottom view of the intermediate body 430 and the thermal transmitting module 421 of the third preferred embodiment of an electronic apparatus 400 according to the present invention. The intermediate body 430 has a plurality of conductors 431 and a through hole 432. The thermal transmitting module 421 has a body 422 and a plurality of connecting parts 423. The body 422 is located and passed through the through hole 432 of the intermediate body 430 to connect with the chip 412. The connecting parts 423 are extended outward from the body 422 and are extended over the edge of the intermediate body 430 to connect with the bridge unit 424. The connecting parts 423 pass between but not electrically connect with the conductors 431. The connecting parts 423 and the bridge unit 424 may be formed by heat pipes. The body 422, the connecting parts 423 and the bridge unit 424 may be one-piece molded by a metal of high thermal conductivity or be individually formed and then assembled to be a module.

Figure 4C:
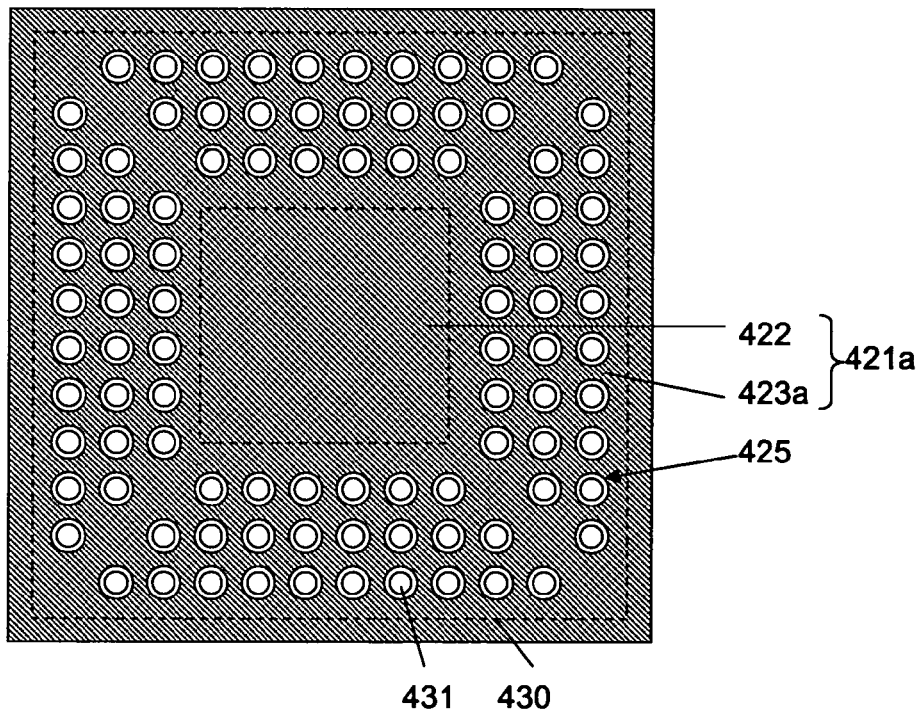
FIG. 4c is a bottom view showing an intermediate body and another thermal transmitting module of the third preferred embodiment of an electronic apparatus according to the present invention.

FIG. 4c shows a bottom view of the intermediate body 430 and another thermal transmitting module 421a. As shown in FIGS. 4a and 4c, the thermal transmitting module 421a includes a body 422 and a connecting part 423a. The connecting part 423a is a metal plate with a plurality of through holes 425 to be fixed on a surface of the intermediate body 430 by adhesion. The connecting part 423a is extended outward from the body 422 and is extended over the edge of the intermediate body 430 to connect with the bridge unit 424. The through holes 425 are disposed correspondingly to the position and shape of the conductors 431 such that the conductors 431 respectively pass through the through holes 425 to electrically connect with the circuit board 130. Please note that the conductors 431 cannot be in contact with the connecting part 423a.

Figure 5:
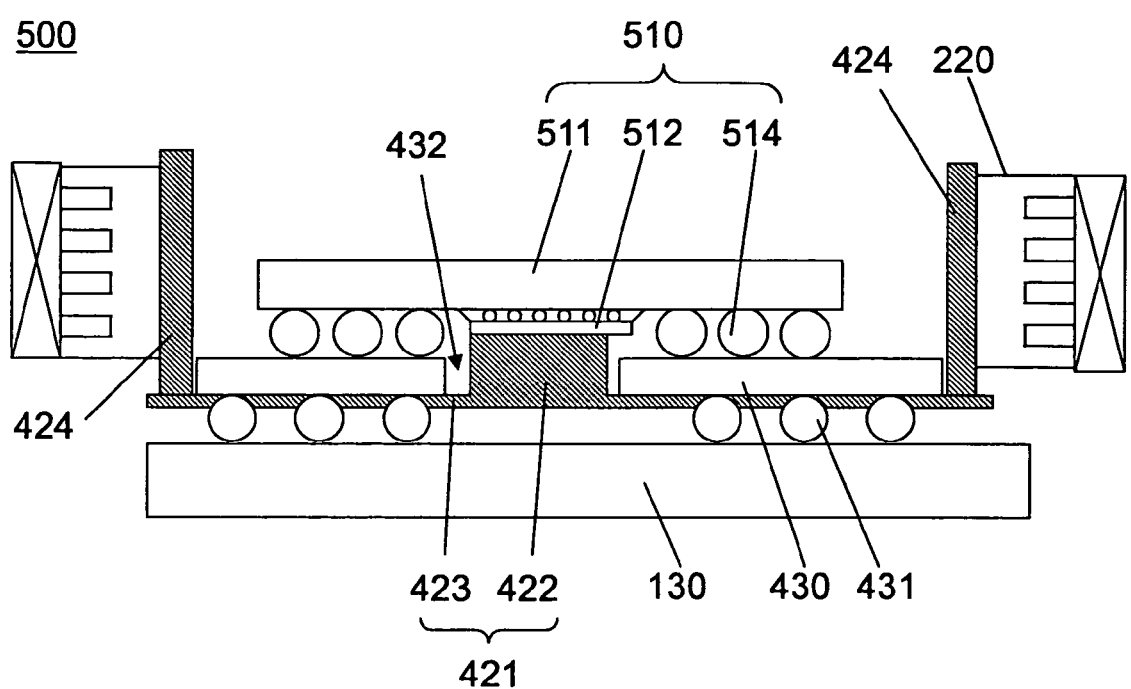
FIG. 5 is a cross-sectional view showing a fourth preferred embodiment of an electronic apparatus according to the present invention.

FIG. 5 shows a cross-sectional view of a fourth preferred embodiment of an electronic apparatus 500 according to the present invention. The electronic apparatus 500 includes a package 510 and a plurality of thermal dissipating modules 220 disposed at one side of a circuit board 130. The package 510 includes a substrate 511, a heat source 512 and a plurality of electric terminals 514. The heat source 512 and the electric terminals 514 are located between the substrate 511 and the circuit board 130. The heat source 512 may be a chip. In order to enhance the thermal dissipating efficiency of the heat source 512, the electronic apparatus 500 further includes an intermediate body 430, a thermal transmitting module 421 and a plurality of bridge units 424. The intermediate body 430 is used for electrically connecting between the package 510 and the circuit board 130. That is, the intermediate body 430 is electrically connected between the package 510 and the electric terminals 514. A plurality of conductors 431 are located on the other side of the intermediate body 430 to electrically connect with the circuit board 130. In order to be thermal dissipated from the heat source 512 to outside, the intermediate body 430 has a through hole 432 located at the projection area of the heat source 512. At least one thermal transmitting module 421 is located between the package 510 and the circuit board 130 and is connected with the heat source 512 and the bridge units 424. The bridge unit 424 is connected to the thermal dissipating module 220. The thermal dissipating modules 220 are located at the lateral side of the intermediate body 430 or the package 510. The heat source 512 is thermal dissipated through the thermal transmitting module 421 and the bridge units 424 to the thermal dissipating modules 220.

Because at least one heat source of the package between the substrate and the circuit board has no effective thermal transmitting path, the present invention provides a thermal transmitting module to thermal dissipate the heats from the heat source to a thermal dissipating module. The thermal dissipating module and the package are located at the same side of the circuit board. The thermal transmitting module is located between the heat source and the thermal dissipating module to form an effective thermal transmitting path for lowering the operation temperature and enhancing the reliability. The thermal transmitting module between the circuit board and the package has a body connected to a surface of the heat source and at least one connecting part extended outward from the body to connect with the thermal dissipating module. The package of the present invention is a ball grid array (BGA) package or a pin grid array (PGA) package. The heat source is a chip connected to the substrate by a wire-bonding or a flip-chip bonding.

The present invention further provides at least one bridge unit passing through the package or locating at the lateral side of the package to be a thermal transmitting path between the thermal transmitting module and the thermal dissipating module. In addition, the present invention further includes an intermediate body electrically connected between the package and the circuit board. The electrical connection path between the package and the circuit board may be re-distributed by the intermediate body to facilitate the connecting part passing through the electric connecting structures between the intermediate body and the circuit board. The thermal transmitting module is not in contact with the circuit board or the package.

In summary, the present invention achieves excellent functions and results as follows:

1. Providing an effective thermal transmitting path for a heat source facing to the circuit board to lower the operation temperature;

2. The thermal transmitting module will not affect the electrical connection of the electronic apparatus and which needs not to be re-designed, the timing and the cost are thus saved; and 3. Providing a flexible design to the thermal transmitting module based on the embodiments described herein above according to practical requirements.

Although the present invention has been described with reference to specific embodiments, this description is not meant to be construed in a pivoting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. An electronic apparatus, comprising:
   a circuit board;
   a package comprising at least one first heat source and a plurality of electric terminals on a surface facing to the circuit board, wherein the electric terminals electrically connecting to the circuit board;
   a thermal dissipating module located at the same side of the circuit board with the package, wherein the thermal dissipating module is located over a surface of the package apart from the circuit board; and
   a thermal transmitting module located between the package and the circuit board and connecting the first heat source to the thermal dissipating module.

2. The electronic apparatus according to claim 1, wherein the package further comprises at least one second heat source located on a surface of the package apart from the circuit board.

3. The electronic apparatus according to claim 2, wherein the package is a multiple chip package, and the first heat source is a chip, and the second heat source is a chip.

4. The electronic apparatus according to claim 1, wherein the package further comprises a substrate, the first heat source and the electric terminals are disposed on a surface of the substrate facing to the circuit board.

5. The electronic apparatus according to claim 4, further comprising at least one bridge unit connected the thermal transmitting module with the thermal dissipating module.

6. The electronic apparatus according to claim 5, wherein the substrate has at least one through hole, the bridge unit passes through the through hole and is in contact with the thermal transmitting module.

7. The electronic apparatus according to claim 1, further comprising an intermediate body, the electric terminals are electrically connected with the circuit board by an internal circuit of the intermediate body.

8. The electronic apparatus according to claim 7, wherein the intermediate body has a first through hole, the thermal transmitting module passes through the first through hole and connects with the first heat source.

9. The electronic apparatus according to claim 8, wherein the thermal transmitting module comprises a body and at least one connecting part, the body passes through the first through hole and connects with the first heat source, the connecting part is located between the intermediate body and the circuit board and is fixed on a surface of the intermediate body to connect the body with the thermal dissipating module.

10. The electronic apparatus according to claim 9, further comprising at least one bridge unit, the intermediate body has at least one second through hole, the bridge unit passes through the second through hole and connects the thermal transmitting module with the thermal dissipating module.

11. The electronic apparatus according to claim 1, wherein the electric terminal is a solder ball, a pin or a conductive block.

12. An electronic apparatus, comprising:
    a circuit board;
    a package located at one side of the circuit board comprising a substrate, a first chip, a second chip and a plurality of electric terminals exposed to a surface of the package facing to the circuit board and electrically connected to the circuit board, the first chip and the electric terminals are located on a first surface of the substrate, and the second chip is located on a second surface of the substrate;
    a thermal dissipating module located over a surface of the package apart from the circuit board;
    at least one bridge unit connected with the thermal dissipating module; and
    a thermal transmitting module located between the package and the circuit board and connected the first chip with the bridge unit.

13. The electronic apparatus according to claim 12, wherein the substrate has at least one through hole, the bridge unit passes through the through hole and is in contact with the thermal transmitting module.

14. The electronic apparatus according to claim 12, further comprising an intermediate body, the electric terminals are electrically connected with the circuit board by an internal circuit of the intermediate body.

15. The electronic apparatus according to claim 14, wherein the intermediate body has a first through hole, the thermal transmitting module passes through the first through hole and connects with the first chip.

16. The electronic apparatus according to claim 15, wherein the thermal transmitting module comprises a body and at least one connecting part, the body passes through the first through hole and connects with the first chip, the connecting part is located between the intermediate body and the circuit board and is fixed on a surface of the intermediate body to connect the body with the bridge unit.

17. The electronic apparatus according to claim 16, wherein the intermediate body has at least one second through hole, the bridge unit passes through the second through hole and connects with the thermal transmitting module.

18. The electronic apparatus according to claim 12, wherein the thermal dissipating module is in contact with the second chip of the package.

19. The electronic apparatus according to claim 12, wherein the electric terminal is a solder ball, a pin or a conductive block.

* * * * *